(12) United States Patent
Jambunathan et al.

(10) Patent No.: US 12,419,091 B2
(45) Date of Patent: Sep. 16, 2025

(54) SOURCE ELECTRODE AND DRAIN ELECTRODE PROTECTION FOR NANOWIRE TRANSISTORS

(71) Applicant: Intel Corporation, Santa Clara, CA (US)

(72) Inventors: Karthik Jambunathan, Portland, OR (US); Biswajeet Guha, Hillsboro, OR (US); Anand S. Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 613 days.

(21) Appl. No.: 17/853,320

(22) Filed: Jun. 29, 2022

(65) Prior Publication Data

US 2022/0336634 A1    Oct. 20, 2022

Related U.S. Application Data

(63) Continuation of application No. 16/646,124, filed as application No. PCT/US2017/068624 on Dec. 28, 2017, now Pat. No. 11,411,096.

(51) Int. Cl.
*H10D 30/43*   (2025.01)
*H10D 30/01*   (2025.01)
(Continued)

(52) U.S. Cl.
CPC ......... *H10D 64/017* (2025.01); *H10D 30/014* (2025.01); *H10D 30/43* (2025.01);
(Continued)

(58) Field of Classification Search
CPC ............. H01L 21/76805; H01L 23/485; H01L 21/28518; H01L 21/76831;
(Continued)

(56) References Cited

U.S. PATENT DOCUMENTS 8,492,854 B1   7/2013   Cheng
9,343,300 B1   5/2016   Jacob
(Continued)

FOREIGN PATENT DOCUMENTS

WO   WO-2017-052594   3/2017
WO   WO-2017052617    3/2017
WO   WO-2017111850    6/2017

OTHER PUBLICATIONS

International Search Report and Written Opinion for International Patent Application No. PCT/US17/68624 mailed Sep. 28, 2018, 15 pgs.

(Continued)

*Primary Examiner* — Xiaoming Liu
(74) *Attorney, Agent, or Firm* — Schwabe, Williamson & Wyatt P.C.

(57) ABSTRACT

Embodiments herein describe techniques, systems, and method for a semiconductor device. A nanowire transistor may include a channel region including a nanowire above a substrate, a source electrode coupled to a first end of the nanowire through a first etch stop layer, and a drain electrode coupled to a second end of the nanowire through a second etch stop layer. A gate electrode may be above the substrate to control conductivity in at least a portion of the channel region. A first spacer may be above the substrate between the gate electrode and the source electrode, and a second spacer may be above the substrate between the gate electrode and the drain electrode. A gate dielectric layer may be between the channel region and the gate electrode. Other embodiments may be described and/or claimed.

16 Claims, 11 Drawing Sheets

(51) Int. Cl.
*H10D 30/62* (2025.01)
*H10D 30/67* (2025.01)
*H10D 62/10* (2025.01)
*H10D 64/01* (2025.01)
*H10D 64/23* (2025.01)
*H01L 21/02* (2006.01)
*H10D 62/80* (2025.01)
*H10D 62/83* (2025.01)
*H10D 62/85* (2025.01)
*H10D 99/00* (2025.01)

(52) U.S. Cl.
CPC ..... *H10D 30/6219* (2025.01); *H10D 30/6713* (2025.01); *H10D 30/6735* (2025.01); *H10D 30/6757* (2025.01); *H10D 62/121* (2025.01); *H10D 64/018* (2025.01); *H10D 64/251* (2025.01); *H10D 64/258* (2025.01); *H01L 21/02532* (2013.01); *H01L 21/02535* (2013.01); *H01L 21/02543* (2013.01); *H01L 21/02546* (2013.01); *H01L 21/02565* (2013.01); *H01L 21/02603* (2013.01); *H10D 30/021* (2025.01); *H10D 30/031* (2025.01); *H10D 30/6741* (2025.01); *H10D 30/6743* (2025.01); *H10D 30/675* (2025.01); *H10D 30/6755* (2025.01); *H10D 62/80* (2025.01); *H10D 62/83* (2025.01); *H10D 62/85* (2025.01); *H10D 99/00* (2025.01)

(58) Field of Classification Search
CPC ........ H01L 21/76855; H01L 21/76877; B82Y 10/00; H10D 84/834; H10D 30/024; H10D 30/62; H10D 84/0158; H10D 84/0193
See application file for complete search history.

(56) References Cited

U.S. PATENT DOCUMENTS

| | | | |
|---|---|---|---|
| 9,590,038 | B1 | 3/2017 | Kim |
| 10,756,216 | B2 | 8/2020 | Miao |
| 2004/0227181 | A1 | 11/2004 | Yeo |
| 2013/0288438 | A1* | 10/2013 | Jensen .............. H01L 29/66628 438/197 |
| 2014/0225065 | A1 | 8/2014 | Rachmady et al. |
| 2014/0264280 | A1 | 9/2014 | Kim et al. |
| 2015/0243747 | A1 | 8/2015 | Kittl |
| 2015/0295084 | A1* | 10/2015 | Obradovic ........... H10D 62/121 257/347 |
| 2015/0333162 | A1 | 11/2015 | Bouche |
| 2016/0141361 | A1 | 5/2016 | Wang |
| 2016/0233164 | A1* | 8/2016 | Choi .................... H10D 62/822 |
| 2016/0308016 | A1 | 10/2016 | Choi |
| 2016/0351570 | A1 | 12/2016 | Park |
| 2017/0154958 | A1 | 6/2017 | Fung |
| 2017/0154973 | A1 | 6/2017 | Ching |
| 2017/0170270 | A1 | 6/2017 | Chu et al. |
| 2018/0097088 | A1 | 4/2018 | Seo |
| 2018/0248011 | A1 | 8/2018 | Mehandru |
| 2018/0358436 | A1 | 12/2018 | Jambunathan |
| 2020/0006488 | A1 | 1/2020 | Mehandru |
| 2020/0343379 | A1 | 10/2020 | Sharma |

OTHER PUBLICATIONS

International Preliminary Report on Patentability for International Patent Application No. PCT/US17/68624, mailed Jul. 9, 2020, 12 pgs.

* cited by examiner

SOURCE ELECTRODE AND DRAIN ELECTRODE PROTECTION FOR NANOWIRE TRANSISTORS

CROSS-REFERENCE TO RELATED APPLICATION

This patent application is continuation of U.S. patent application Ser. No. 16/646,124, filed Mar. 10, 2020, which is a U.S. National Phase Application under 35 U.S.C. § 371 of International Application No. PCT/US2017/068624, filed Dec. 28, 2017, entitled "SOURCE ELECTRODE AND DRAIN ELECTRODE PROTECTION FOR NANOWIRE TRANSISTORS," which designates the United States of America, the entire disclosure of which are hereby incorporated by reference in their entirety and for all purposes.

FIELD

Embodiments of the present disclosure generally relate to the field of integrated circuits, and more particularly, to nanowire transistors.

BACKGROUND

In a gate last or a replacement gate scheme for fabricating a nanowire transistor, a gate dielectric layer and a gate electrode may be formed after a source electrode and a drain electrode have been formed. Hence, a source electrode or a drain electrode may be partially removed unintentionally during the formation of the gate electrode, leading to poor transistor characteristics and reduced device yield. In addition, multiple stacked nanowires of a nanowire transistor contained within a small dimension, and a sacrificial layer around the nanowires having materials similar to a source electrode or a drain electrode, may further make the damages to the source electrode or the drain electrode worse.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
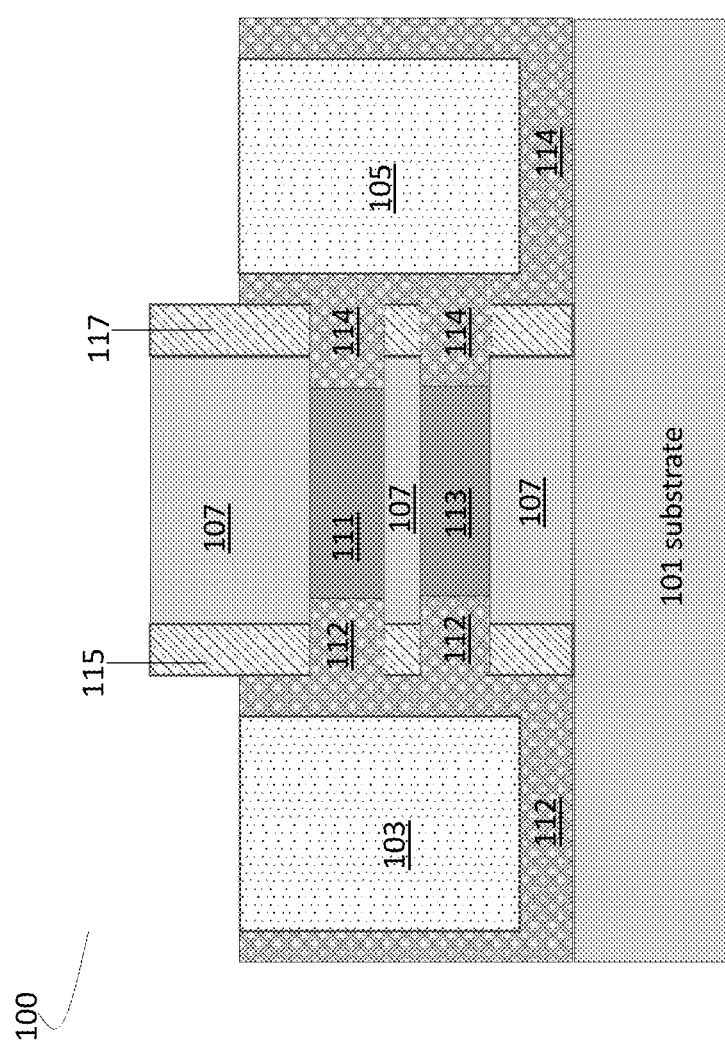
FIG. 1 schematically illustrates an example nanowire transistor including an etch stop layer between a source electrode or a drain electrode and a channel region including a nanowire, in accordance with some embodiments.

A part of a source electrode or a part of a drain electrode of a nanowire transistor may be removed unintentionally in a gate last fabrication scheme when a gate electrode is formed for the nanowire transistor. Some current solutions may increase a length of a nanowire channel, or increase a spacer thickness to protect the source electrode or the drain electrode from being damaged. Such solutions may result in a larger device with reduced drive current, reduced gate control, and reduced transistor density.

In embodiments, an etch stop layer may be formed between a source electrode and a nanowire in a channel region of a nanowire transistor. Similarly, an etch stop layer may be formed between a drain electrode and a nanowire in the channel region. The etch stop layer may include materials similar to the materials in the nanowire channels, with some added dopants to improve its etch resistance. Such an etch stop layer may prevent and protect a source electrode or a drain electrode from being removed unintentionally, without increasing the channel length or spacer thickness.

Embodiments herein may present a semiconductor device including a nanowire transistor. The nanowire transistor may include a substrate, a channel region including a nanowire above the substrate, a source electrode and a drain electrode above the substrate. The source electrode may be coupled to a first end of the nanowire through a first etch stop layer between the source electrode and the nanowire, and the drain electrode may be coupled to a second end of the nanowire through a second etch stop layer between the drain electrode and the nanowire. A gate electrode may be above the substrate to control conductivity in at least a portion of the channel region. A first spacer may be above the substrate between the gate electrode and the source electrode, and a second spacer may be above the substrate between the gate electrode and the drain electrode. A gate dielectric layer may be between the channel region and the gate electrode.

Embodiments herein may present a method for forming a nanowire transistor. The method may include forming one or more fins separated by a sacrificial layer above a substrate, where a fin of the one or more fins may be a nanowire. The method may further include patterning a gate area above the one or more fins and the sacrificial layer, and forming a first spacer and a second spacer around the gate area. In addition, the method may include forming a first etch stop layer next to the first spacer, next to a first end of the one or more fins, and above the substrate, and forming a second etch stop layer next to the second spacer, next to a second end of the one or more fins, and above the substrate. Furthermore, the method may include forming a source electrode within the first etch stop layer, and forming a drain electrode within the second etch stop layer. Moreover, the method may include removing the sacrificial layer to expose the one or more fins, forming a gate dielectric layer around the one or more fins between the first spacer and the second spacer, and forming a gate electrode around the gate dielectric layer.

Embodiments herein may present a computing device. The computing device may include a processor and a memory device coupled to the processor. The memory device or the processor may include a nanowire transistor. The nanowire transistor may include a substrate and a channel region including a nanowire above the substrate. A source electrode and a drain electrode may be above the substrate. The source electrode may be coupled to a first end of the nanowire through a first etch stop layer between the source electrode and the nanowire, and the drain electrode may be coupled to a second end of the nanowire through a second etch stop layer between the drain electrode and the nanowire. A gate electrode may be above the substrate to control conductivity in at least a portion of the channel region. A first spacer may be above the substrate between the gate electrode and the source electrode, and a second spacer above the substrate between the gate electrode and the drain electrode. A gate dielectric layer may be between the channel region and the gate electrode.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 schematically illustrates an example nanowire transistor 100 including an etch stop layer, e.g., an etch stop layer 112, or an etch stop layer 114, between a source electrode 103 or a drain electrode 105 and a channel region including a nanowire, e.g., a nanowire 111 or a nanowire 113, in accordance with some embodiments. For clarity, features of the nanowire transistor 100, the etch stop layer 112, the etch stop layer 114, the source electrode 103, the drain electrode 105, the nanowire 111, and the nanowire 113, may be described below as examples for understanding a nanowire transistor, an etch stop layer, a source electrode, a drain electrode, and a nanowire. Further, it is to be understood that one or more of the components of a nanowire transistor, an etch stop layer, a source electrode, a drain electrode, and a nanowire may include additional and/or varying features from the description below, and may include any device that one having ordinary skill in the art would consider and/or refer to as a nanowire transistor, an etch stop layer, a source electrode, a drain electrode, and a nanowire.

In embodiments, the nanowire transistor 100 may be an n-type transistor or a p-type transistor. The nanowire transistor 100 may include a substrate 101, a channel region including a nanowire 111 and a nanowire 113 above the substrate 101, the source electrode 103 above the substrate 101, the drain electrode 105 above the substrate 101, the etch stop layer 112, the etch stop layer 114, a gate electrode 107, a spacer 115 above the substrate 101 between the gate electrode 107 and the source electrode 103, and a spacer 117 above the substrate 101 between the gate electrode 107 and the drain electrode 105.

In embodiments, the nanowire 111 or the nanowire 113 may be a rectangular nanowire, a circular nanowire, or a nanoribbon. The nanowire 111 or the nanowire 113 may include Si, Ge, Sn, In, Ga, As, Al, InAs, SiGe, InGaAs, InP, or a metal oxide.

In embodiments, the source electrode 103 may be coupled to a first end of the nanowire 111 and the nanowire 113 through the etch stop layer 112 between the source electrode 103 and the nanowire 111 and the nanowire 113. In addition, the etch stop layer 112 may be around sidewalls of the source electrode 103, between the source electrode 103 and the substrate 101. Similarly, the drain electrode 105 may be coupled to a second end of the nanowire 111 and the nanowire 113 through the etch stop layer 114 between the drain electrode 105 and the nanowire 111 and the nanowire 113, and the etch stop layer 114 may be around sidewalls of the drain electrode 105, between the drain electrode 105 and the substrate 101. The etch stop layer 112 or the etch stop layer 114 may include materials similar to the materials in the nanowire 111 and the nanowire 113, with some added dopants to improve the etch resistance. For example, the etch stop layer 112 or the etch stop layer 114 may be doped with boron (B) or phosphorus (P). In some embodiments, the etch stop layer 112 or the etch stop layer 114 may include boron doped Si, boron doped Ge, boron doped SiGe, phosphorus doped Si, phosphorus doped Ge, or phosphorus doped SiGe. The etch stop layer 112 or the etch stop layer 114 may have a thickness between the source electrode and the nanowire less than 25 nanometer (nm).

In embodiments, the gate electrode 107 may be above the substrate 101 to control conductivity in at least a portion of the channel region, e.g., the nanowire 111 and the nanowire 113. The gate electrode 107 may be around the nanowire 111 and the nanowire 113. A gate dielectric layer, not shown, may be between the channel region, e.g., the nanowire 111 and the nanowire 113, and the gate electrode 107. In some embodiments, the gate dielectric layer may include silicon and oxygen, silicon and nitrogen, yttrium and oxygen, silicon, oxygen, and nitrogen, aluminum and oxygen, hafnium and oxygen, tantalum and oxygen, or titanium and oxygen. For example, the gate dielectric layer may include silicon oxide ($SiO_2$), silicon nitride ($SiN_x$), yttrium oxide ($Y_2O_3$), silicon oxynitride ($SiO_xN_y$), aluminum oxide ($Al_2O_3$), hafnium(IV) oxide ($HfO_2$), tantalum oxide ($Ta_2O_5$), titanium dioxide ($TiO_2$), or other materials.

In embodiments, the substrate 101 may be a silicon substrate, a glass substrate, such as soda lime glass or borosilicate glass, a metal substrate, a plastic substrate, a polyimide substrate, or other suitable substrate. The substrate 101 may include silicon, sapphire, SiC, GaN, or AlN.

In embodiments, the source electrode 103, the drain electrode 105, or the gate electrode 107 may be formed as a single layer or a stacked layer using one or more conductive films including a conductive material. For example, the source electrode 103, the drain electrode 105, or the gate electrode 107 may include a metallic material, a conductive polymer, a polysilicon, a titanium silicide, a phosphorus (n+) doped Si, a boron doped SiGe, or an alloy of a semiconductor material and a metal. For example, the source electrode 103, the drain electrode 105, or the gate electrode 107 may include gold (Au), platinum (Pt), ruthenium (Ru), iridium (Ir), titanium (Ti), aluminum (Al), molybdenum (Mo), copper (Cu), tantalum (Ta), tungsten (W), nickel (Ni), chromium (Cr), hafnium (Hf), indium (In), or an alloy of Ti, Mo, Au, Pt, Al Ni, Cu, Cr, TiAlN, HfAlN, or InAlO. The source electrode 103, the drain electrode 105, or the gate electrode 107 may include tantalum nitride (TaN), titanium nitride (TiN), iridium-tantalum alloy (Ir—Ta), indium-tin oxide (ITO), the like, and/or a combination thereof.

Figure 2:
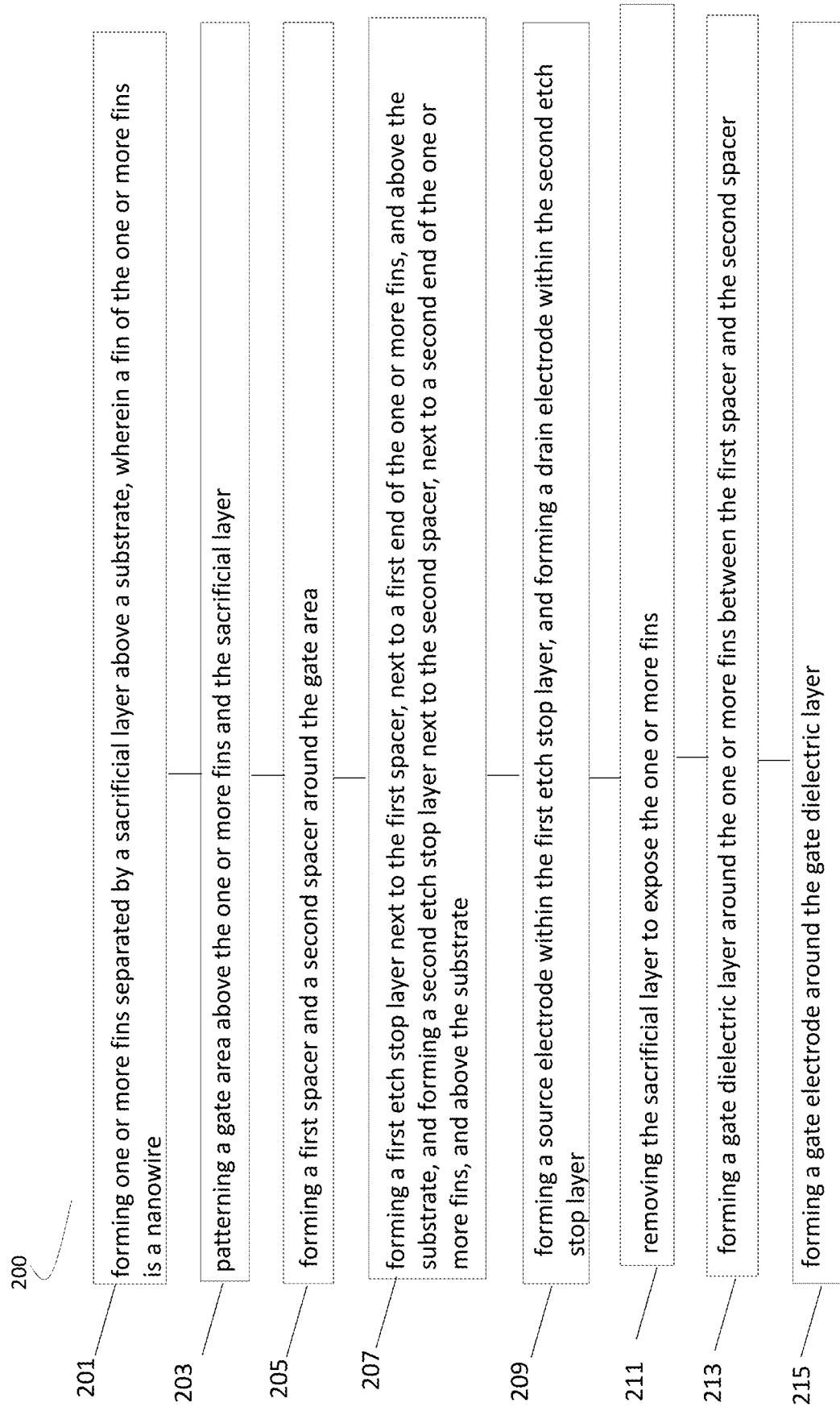
FIG. 2 illustrates a process for forming a nanowire transistor including an etch stop layer between a source electrode or a drain electrode and a channel region including a nanowire, in accordance with some embodiments.

FIG. 2 illustrates a process 200 for forming a nanowire transistor including an etch stop layer between a source electrode or a drain electrode and a channel region including a nanowire, in accordance with some embodiments. Similarly, FIGS. 3-9 illustrate various steps of a process for forming a nanowire transistor including an etch stop layer between a source electrode or a drain electrode and a channel region including a nanowire. In embodiments, the process 200 may be used to form a nanowire transistor including an etch stop layer between a source electrode or a drain electrode and a channel region including a nanowire, similar to the nanowire transistor 100 in FIG. 1. FIGS. 3-9 may illustrate more details of the process 200 shown in FIG. 2.

Figure 3:
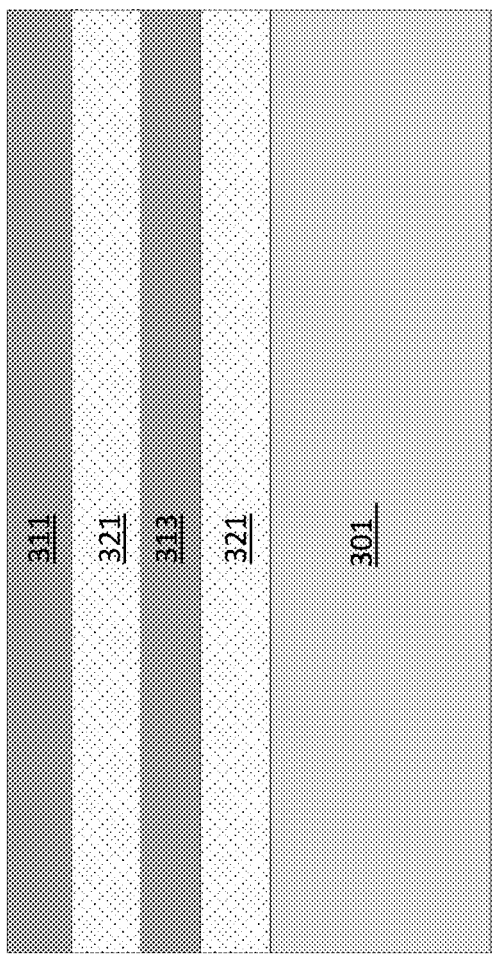
FIGS. 3-9 illustrate various steps of a process for forming a nanowire transistor including an etch stop layer between a source electrode or a drain electrode and a channel region including a nanowire, in accordance with some embodiments.

At block 201, the process 200 may include forming one or more fins separated by a sacrificial layer above a substrate, wherein a fin of the one or more fins is a nanowire. For example, as shown in FIG. 3, the process 200 may include a fin 311, and a fin 313, separated by a sacrificial layer 321 above a substrate 301. The fin 311 or the fin 313 may be a nanowire.

Figure 4:
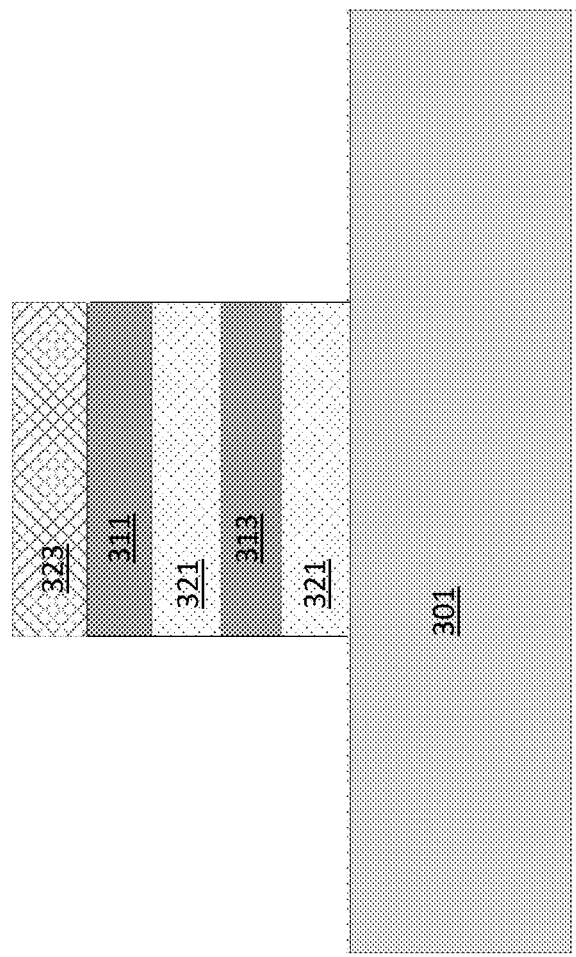

At block 203, the process 200 may include patterning a gate area above the one or more fins and the sacrificial layer. For example, as shown in FIG. 4, the process 200 may include forming a gate area defined by a dummy gate 323 above the fin 311, the fin 313, and the sacrificial layer 321.

Figure 5:
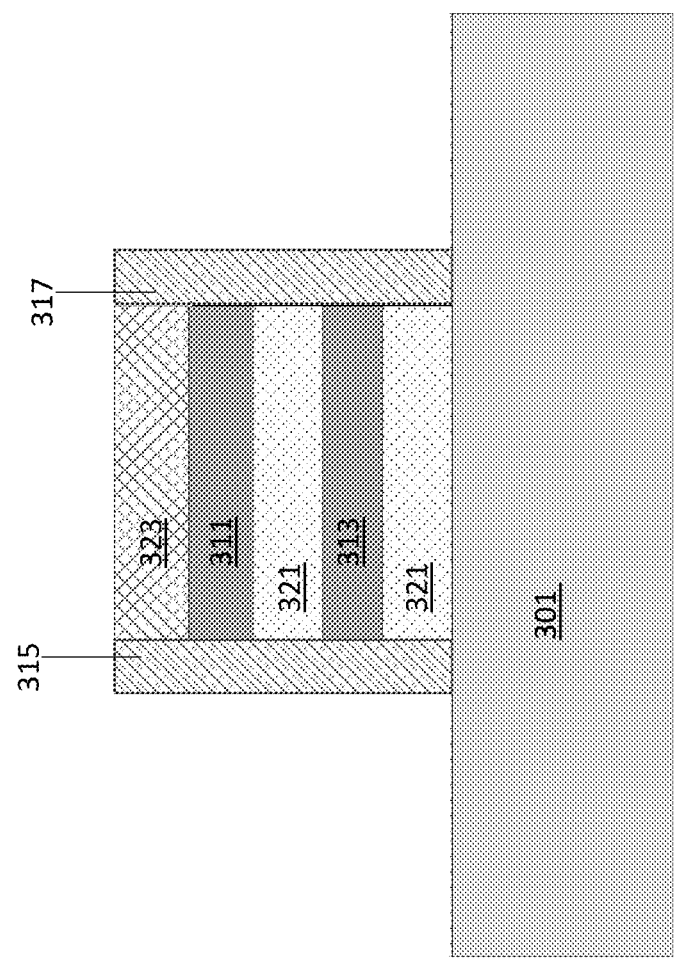

At block 205, the process 200 may include forming a first spacer and a second spacer around the gate area. For example, as shown in FIG. 5, the process 200 may include forming a first spacer 315 and a second spacer 317 around the gate area, which may be defined by the dummy gate 323.

Figure 6:
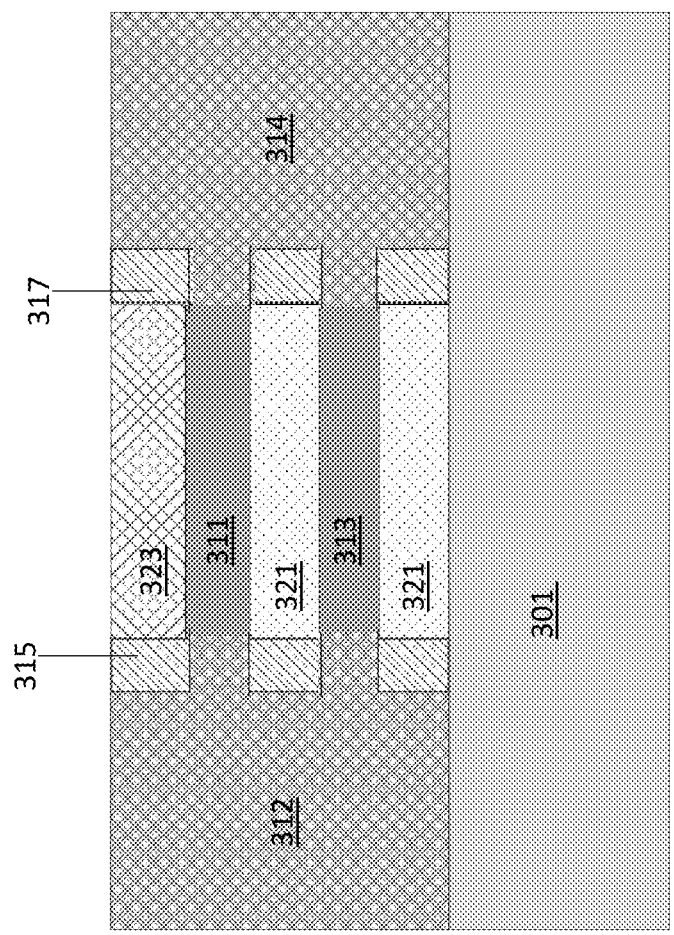

At block 207, the process 200 may include forming a first etch stop layer next to the first spacer, next to a first end of the one or more fins, and above the substrate, and forming a second etch stop layer next to the second spacer, next to a second end of the one or more fins, and above the substrate. For example, as shown in FIG. 6, the process 200 may include forming a first etch stop layer 312 and a second etch stop layer 314. The first etch stop layer 312 may be next to the first spacer 315, next to a first end of the fin 311 and the fin 313, and above the substrate 301. The second etch stop layer 314 may be next to the second spacer 317, next to a second end of the fin 311 and the fin 313, and above the substrate 301.

Figure 7:
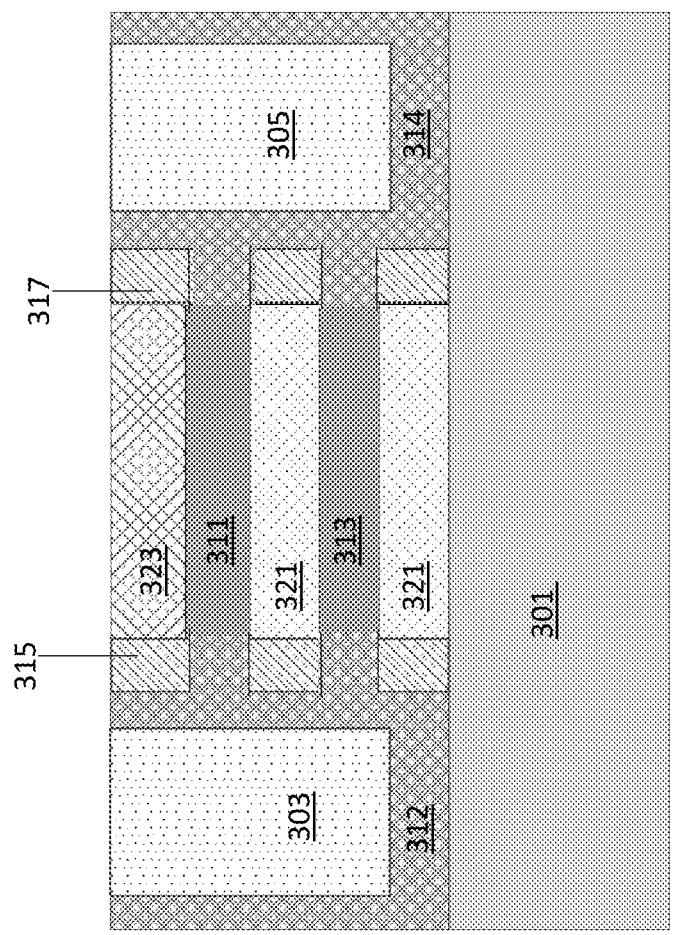

At block 209, the process 200 may include forming a source electrode within the first etch stop layer, and forming a drain electrode within the second etch stop layer. For example, as shown in FIG. 7, the process 200 may include forming a source electrode 303 within the first etch stop layer 312, and forming a drain electrode 305 within the second etch stop layer 314.

Figure 8:
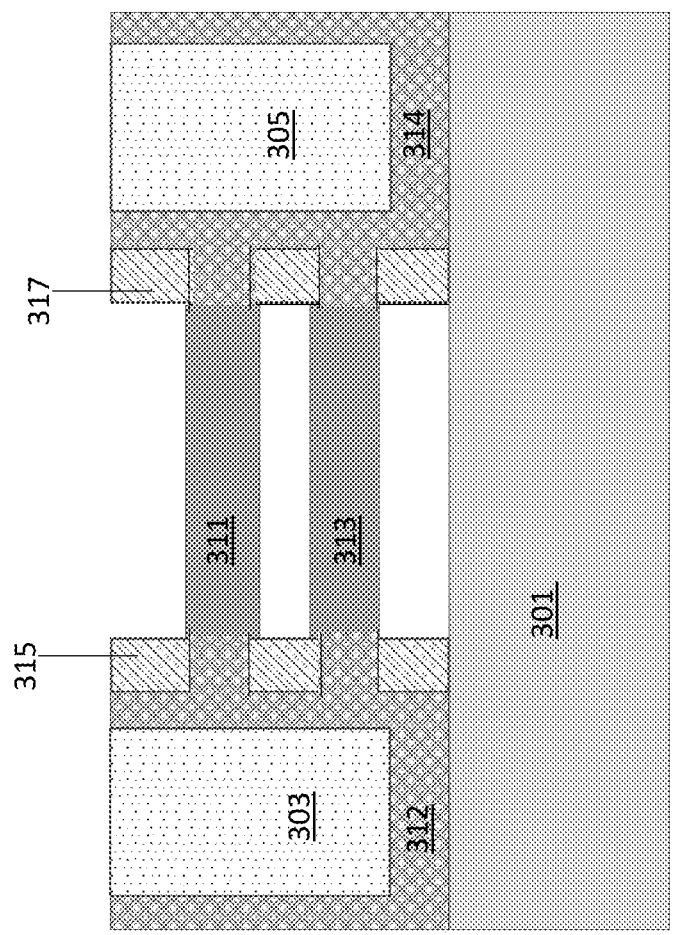

At block 211, the process 200 may include removing the sacrificial layer to expose the one or more fins. For example, as shown in FIG. 8, the process 200 may include removing the sacrificial layer 321 to expose the fin 311 and the fin 313. In addition, the dummy gate 323 above the sacrificial layer 321 may be removed as well.

Figure 9:
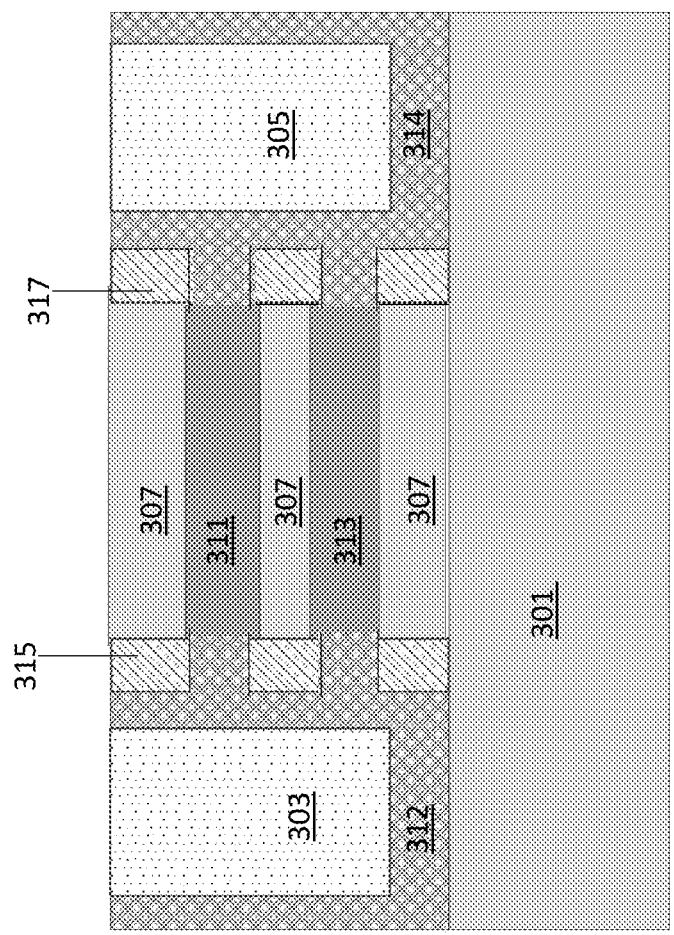

At block 213, the process 200 may include forming a gate dielectric layer around the one or more fins between the first spacer and the second spacer. At block 215, the process 200 may include forming a gate electrode around the gate dielectric layer. For example, as shown in FIG. 9, the process 200 may include forming a gate dielectric layer, not shown, around the fin 311 and the fin 313 between the first spacer 315 and the second spacer 317, and further forming a gate electrode 307 around the gate dielectric layer.

Figure 10:
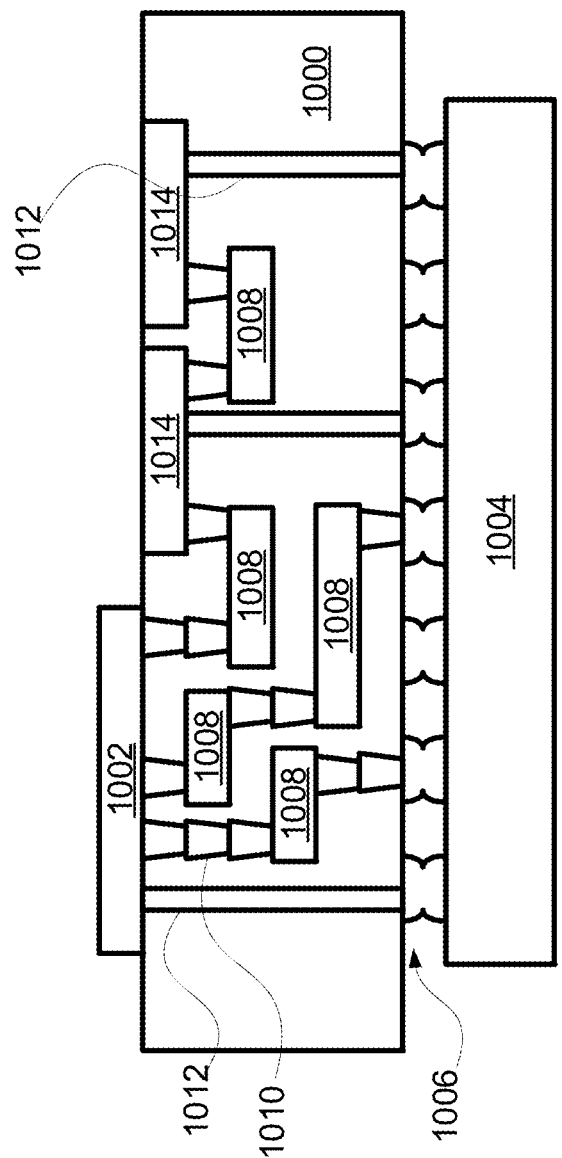
FIG. 10 schematically illustrates an interposer implementing one or more embodiments of the disclosure, in accordance with some embodiments.

FIG. 10 illustrates an interposer 1000 that includes one or more embodiments of the disclosure. The interposer 1000 is an intervening substrate used to bridge a first substrate 1002 to a second substrate 1004. The first substrate 1002 may be, for instance, a substrate support the nanowire transistor 100 including the etch stop layer 112, or the etch stop layer 114, between the source electrode 103 or the drain electrode 105 and a channel region including the nanowire 111 and the nanowire 113, shown in FIG. 1. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000.

In accordance with embodiments of the disclosure, apparatuses or processes disclosed herein may be used in the fabrication of interposer 1000.

Figure 11:
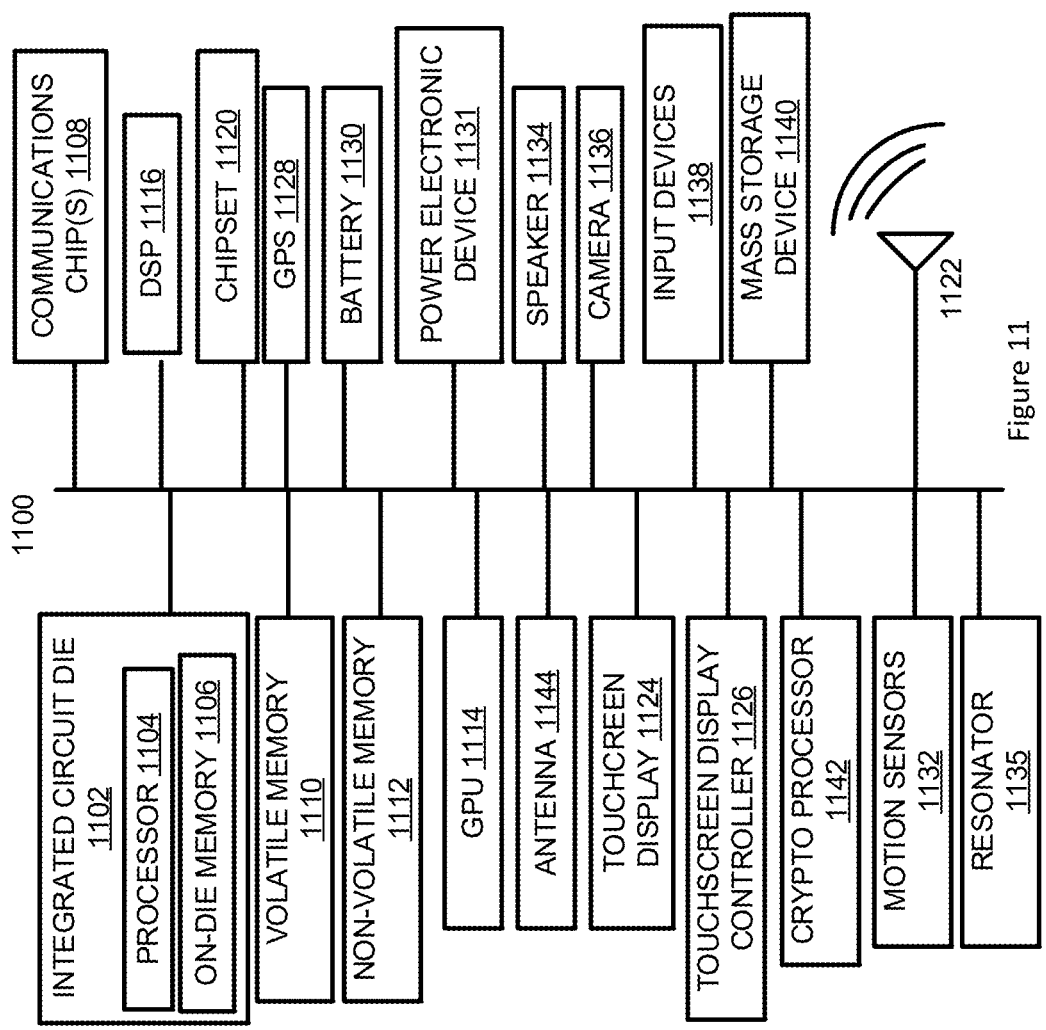
FIG. 11 schematically illustrates a computing device built in accordance with an embodiment of the disclosure, in accordance with some embodiments.

FIG. 11 illustrates a computing device 1100 in accordance with one embodiment of the disclosure. The computing device 1100 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 1100 include, but are not limited to, an integrated circuit die 1102 and at least one communications logic unit 1108. In some implementations the communications logic unit 1108 is fabricated within the integrated circuit die 1102 while in other implementations the communications logic unit 1108 is fabricated in a separate integrated circuit chip that may be bonded to a substrate or motherboard that is shared with or electronically coupled to the integrated circuit die 1102. The integrated circuit die 1102 may include a processor 1104 as well as on-die memory 1106, often used as cache memory, which can be provided by technologies such as embedded DRAM (eDRAM), or SRAM. For example, the processor 1104 or the on-die memory 1106, or other control circuits in the integrated circuit die 1102 may include the nanowire transistor 100 including the etch stop layer 112, or the etch stop layer 114, between the source electrode 103 or the drain electrode 105 and a channel region including the nanowire 111 and the nanowire 113, shown in FIG. 1, or a nanowire transistor formed following the process 200 shown in FIG. 2.

In embodiments, the computing device 1100 may include a display or a touchscreen display 1124, and a touchscreen display controller 1126. A display or the touchscreen display 1124 may include a FPD, an AMOLED display, a TFT LCD, a micro light-emitting diode (µLED) display, or others.

Computing device 1100 may include other components that may or may not be physically and electrically coupled to the motherboard or fabricated within a SoC die. These other components include, but are not limited to, volatile memory 1110 (e.g., dynamic random access memory (DRAM), non-volatile memory 1112 (e.g., ROM or flash memory), a graphics processing unit 1114 (GPU), a digital signal processor (DSP) 1116, a crypto processor 1142 (e.g., a specialized processor that executes cryptographic algorithms within hardware), a chipset 1120, at least one antenna 1122 (in some implementations two or more antenna may be used), a battery 1130 or other power source, a power electronic device 1131, a voltage regulator (not shown), a global positioning system (GPS) device 1128, a compass, a motion coprocessor or sensors 1132 (that may include an accelerometer, a gyroscope, and a compass), a microphone (not shown), a speaker 1134, a resonator 1135, a camera 1136, user input devices 1138 (such as a keyboard, mouse, stylus, and touchpad), and a mass storage device 1140 (such as hard disk drive, compact disk (CD), digital versatile disk (DVD), and so forth). In embodiments, various components may include the nanowire transistor 100 including the etch stop layer 112, or the etch stop layer 114, between the source electrode 103 or the drain electrode 105 and a channel region including the nanowire 111 and the nanowire 113, shown in FIG. 1, or a nanowire transistor formed following the process 200 shown in FIG. 2.

The computing device 1100 may incorporate further transmission, telecommunication, or radio functionality not already described herein. In some implementations, the computing device 1100 includes a radio that is used to communicate over a distance by modulating and radiating electromagnetic waves in air or space. In further implementations, the computing device 1100 includes a transmitter and a receiver (or a transceiver) that is used to communicate over a distance by modulating and radiating electromagnetic waves in air or space.

The communications logic unit 1108 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 1108 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 1100 may include a plurality of communications logic units 1108. For instance, a first communications logic unit 1108 may be dedicated to shorter range wireless communications such as Wi-Fi, NFC, and Bluetooth and a second communications logic unit 1108 may be dedicated to longer range wireless communications such as GPS, EDGE, GPRS, CDMA, WiMAX, LTE, Ev-DO, and others.

The processor 1104 of the computing device 1100 includes one or more devices, such as transistors. The term "processor" may refer to any device or portion of a device that processes electronic data from registers and/or memory to transform that electronic data into other electronic data that may be stored in registers and/or memory. The communications logic unit 1108 may also include one or more devices, such as transistors.

In further embodiments, another component housed within the computing device 1100 may contain one or more devices, such as the power electronic device 1131, that are formed in accordance with implementations of the current disclosure, e.g., the nanowire transistor 100 including the etch stop layer 112, or the etch stop layer 114, between the source electrode 103 or the drain electrode 105 and a channel region including the nanowire 111 and the nanowire 113, shown in FIG. 1, or a nanowire transistor formed following the process 200 shown in FIG. 2.

In various embodiments, the computing device 1100 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

Some non-limiting Examples are provided below.

Example 1 may include a semiconductor device including a nanowire transistor, comprising: a substrate; a channel region including a nanowire above the substrate; a source electrode and a drain electrode above the substrate, wherein the source electrode is coupled to a first end of the nanowire through a first etch stop layer between the source electrode and the nanowire, and the drain electrode is coupled to a second end of the nanowire through a second etch stop layer between the drain electrode and the nanowire; a gate electrode above the substrate to control conductivity in at least a portion of the channel region; a first spacer above the substrate between the gate electrode and the source electrode, a second spacer above the substrate between the gate electrode and the drain electrode; and a gate dielectric layer between the channel region and the gate electrode.

Example 2 may include the semiconductor device of example 1 and/or some other examples herein, wherein the nanowire is a first nanowire, and the channel region further includes a second nanowire, the source electrode is coupled to a first end of the second nanowire through the first etch stop layer between the source electrode and the second nanowire, and the drain electrode is coupled to a second end of the second nanowire through the second etch stop layer between the drain electrode and the second nanowire.

Example 3 may include the semiconductor device of any one of examples 1-2 and/or some other examples herein, wherein the first etch stop layer is around sidewalls of the source electrode, between the source electrode and the substrate, and the second etch stop layer is around sidewalls of the drain electrode, between the drain electrode and the substrate.

Example 4 may include the semiconductor device of any one of examples 1-2 and/or some other examples herein, wherein the gate electrode is around the nanowire.

Example 5 may include the semiconductor device of any one of examples 1-2 and/or some other examples herein, wherein the nanowire transistor is a n-type transistor or a p-type transistor.

Example 6 may include the semiconductor device of any one of examples 1-2 and/or some other examples herein, wherein the nanowire is a rectangular nanowire, a circular nanowire, or a nanoribbon.

Example 7 may include the semiconductor device of any one of examples 1-2 and/or some other examples herein, wherein the first etch stop layer has a thickness between the source electrode and the nanowire less than 25 nm.

Example 8 may include the semiconductor device of any one of examples 1-2 and/or some other examples herein, wherein the nanowire includes Si, Ge, Sn, In, Ga, As, Al, InAs, SiGe, InGaAs, InP, or a metal oxide.

Example 9 may include the semiconductor device of any one of examples 1-2 and/or some other examples herein, wherein the first etch stop layer or the second etch stop layer is doped with boron (B) or phosphorus (P).

Example 10 may include the semiconductor device of any one of examples 1-2 and/or some other examples herein, wherein the first etch stop layer or the second etch stop layer includes boron doped Si, boron doped Ge, boron doped SiGe, phosphorus doped Si, phosphorus doped Ge, or phosphorus doped SiGe.

Example 11 may include the semiconductor device of any one of examples 1-2 and/or some other examples herein, wherein the source electrode, the drain electrode, or the gate electrode includes a metallic material, a conductive polymer, a phosphorus (n+) doped Si, a polysilicon, a titanium silicide, a boron doped SiGe, or an alloy of a semiconductor material and a metal.

Example 12 may include the semiconductor device of any one of examples 1-2 and/or some other examples herein, wherein the substrate includes silicon, sapphire, glass, polyimide, SiC, GaN, or AlN.

Example 13 may include a method for forming a nanowire transistor, the method comprising: forming one or more fins separated by a sacrificial layer above a substrate, wherein a fin of the one or more fins is a nanowire; patterning a gate area above the one or more fins and the sacrificial layer; forming a first spacer and a second spacer around the gate area; forming a first etch stop layer next to the first spacer, next to a first end of the one or more fins, and above the substrate, and forming a second etch stop layer next to the second spacer, next to a second end of the one or more fins, and above the substrate; forming a source electrode within the first etch stop layer, and forming a drain electrode within the second etch stop layer; removing the sacrificial layer to expose the one or more fins; forming a gate dielectric layer around the one or more fins between the first spacer and the second spacer; and forming a gate electrode around the gate dielectric layer.

Example 14 may include the method of example 13 and/or some other examples herein, wherein the nanowire transistor is a n-type transistor or a p-type transistor.

Example 15 may include the method of any one of examples 13-14 and/or some other examples herein, wherein the nanowire is a rectangular nanowire, a circular nanowire, or a nanoribbon.

Example 16 may include the method of any one of examples 13-14 and/or some other examples herein, wherein the nanowire includes Si, Ge, Sn, In, Ga, As, Al, InAs, SiGe, InGaAs, InP, or a metal oxide.

Example 17 may include the method of any one of examples 13-14 and/or some other examples herein, wherein the first etch stop layer or the second etch stop layer is doped with boron (B) or phosphorus (P).

Example 18 may include the method of any one of examples 13-14 and/or some other examples herein, wherein the first etch stop layer or the second etch stop layer includes boron doped Si, boron doped Ge, boron doped SiGe, phosphorus doped Si, phosphorus doped Ge, or phosphorus doped SiGe.

Example 19 may include the method of any one of examples 13-14 and/or some other examples herein, wherein the source electrode, the drain electrode, or the gate electrode includes a metallic material, a conductive polymer, a polysilicon, a titanium silicide, a phosphorus (n+) doped Si, a boron doped SiGe, or an alloy of a semiconductor material and a metal.

Example 20 may include the method of any one of examples 13-14 and/or some other examples herein, wherein the substrate includes silicon, sapphire, glass, polyimide, SiC, GaN, or AlN.

Example 21 may include a computing device, comprising: a processor; and a memory device coupled to the processor, wherein the memory device or the processor includes a nanowire transistor comprising: a substrate; a channel region including a nanowire above the substrate; a source electrode and a drain electrode above the substrate, wherein the source electrode is coupled to a first end of the nanowire through a first etch stop layer between the source electrode and the nanowire, and the drain electrode is coupled to a second end of the nanowire through a second etch stop layer between the drain electrode and the nanowire; a gate electrode above the substrate to control conductivity in at least a portion of the channel region; a first spacer above the substrate between the gate electrode and the source electrode, a second spacer above the substrate between the gate electrode and the drain electrode; and a gate dielectric layer between the channel region and the gate electrode.

Example 22 may include the computing device of example 21 and/or some other examples herein, wherein the nanowire is a first nanowire, and the channel region further includes a second nanowire, the source electrode is coupled to a first end of the second nanowire through the first etch stop layer between the source electrode and the second nanowire, and the drain electrode is coupled to a second end of the second nanowire through the second etch stop layer between the drain electrode and the second nanowire.

Example 23 may include the computing device of any one of examples 21-22 and/or some other examples herein, wherein the first etch stop layer is around sidewalls of the source electrode, between the source electrode and the substrate, and the second etch stop layer is around sidewalls of the drain electrode, between the drain electrode and the substrate.

Example 24 may include the computing device of any one of examples 21-22 and/or some other examples herein, wherein the nanowire is a rectangular nanowire, a circular nanowire, or a nanoribbon.

Example 25 may include the computing device of any one of examples 21-22 and/or some other examples herein, wherein the computing device is a wearable device or a mobile computing device, the wearable device or the mobile computing device including one or more of an antenna, a touchscreen controller, a battery, an audio codec, a video codec, a power amplifier, a global positioning system (GPS) device, a compass, a Geiger counter, an accelerometer, a gyroscope, a speaker, or a camera coupled with the processor.

Example 26 may include one or more computer-readable media having instructions for forming a nanowire transistor, upon execution of the instructions by one or more processors, to perform the method of any one of examples 13-20.

Example 27 may include an apparatus for forming a semiconductor device, the apparatus comprising: means for forming one or more fins separated by a sacrificial layer above a substrate, wherein a fin of the one or more fins is a nanowire; means for patterning a gate area above the one or more fins and the sacrificial layer; means for forming a first spacer and a second spacer around the gate area; means for forming a first etch stop layer next to the first spacer, next to a first end of the one or more fins, and above the substrate, and means for forming a second etch stop layer next to the second spacer, next to a second end of the one or more fins, and above the substrate; means for forming a source electrode within the first etch stop layer, and means for forming a drain electrode within the second etch stop layer; means for removing the sacrificial layer to expose the one or more fins; means for forming a gate dielectric layer around the one or more fins between the first spacer and the second spacer; and means for forming a gate electrode around the gate dielectric layer.

Example 28 may include the apparatus of example 27 and/or some other examples herein, wherein the nanowire transistor is a n-type transistor or a p-type transistor.

Example 29 may include the apparatus of any one of examples 27-28 and/or some other examples herein, wherein the nanowire is a rectangular nanowire, a circular nanowire, or a nanoribbon.

Example 30 may include the apparatus of any one of examples 27-28 and/or some other examples herein, wherein the nanowire includes Si, Ge, Sn, In, Ga, As, Al, InAs, SiGe, InGaAs, InP, or a metal oxide.

Example 31 may include the apparatus of any one of examples 27-28 and/or some other examples herein, wherein the first etch stop layer or the second etch stop layer is doped with boron (B) or phosphorus (P).

Example 32 may include the apparatus of any one of examples 27-28 and/or some other examples herein, wherein the first etch stop layer or the second etch stop layer includes boron doped Si, boron doped Ge, boron doped SiGe, phosphorus doped Si, phosphorus doped Ge, or phosphorus doped SiGe.

Example 33 may include the apparatus of any one of examples 27-28 and/or some other examples herein, wherein the source electrode, the drain electrode, or the gate electrode includes a metallic material, a conductive polymer, a polysilicon, a titanium silicide, a phosphorus (n+) doped Si, a boron doped SiGe, or an alloy of a semiconductor material and a metal.

Example 34 may include the apparatus of any one of examples 27-28 and/or some other examples herein, wherein the substrate includes silicon, sapphire, glass, polyimide, SiC, GaN, or AlN.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
a substrate;
a channel region including a nanowire above the substrate;
a metallic source electrode and a metallic drain electrode above the substrate, wherein the metallic source electrode is laterally separated from a first end of the nanowire by a first semiconductor layer between the metallic source electrode and the nanowire, the first semiconductor layer having an uppermost surface co-planar with an uppermost surface of the metallic source electrode, and the metallic drain electrode is laterally separated from a second end of the nanowire by a second semiconductor layer between the metallic drain electrode and the nanowire, the second semiconductor layer having an uppermost surface co-planar with an uppermost surface of the metallic drain electrode;
a gate electrode over and around the nanowire, the gate electrode having a lateral width between the metallic source electrode and the metallic drain electrode that is greater than a lateral width of the nanowire between the metallic source electrode and the metallic drain electrode;
a first spacer above the substrate between the gate electrode and the metallic source electrode, a second spacer above the substrate between the gate electrode and the metallic drain electrode; and
a gate dielectric layer between the channel region and the gate electrode.

2. The semiconductor device of claim 1, wherein the nanowire is a first nanowire, and the channel region further includes a second nanowire, the metallic source electrode is laterally separated from a first end of the second nanowire by the first semiconductor layer between the metallic source electrode and the second nanowire, and the metallic drain electrode is laterally separated from a second end of the second nanowire by the second semiconductor layer between the metallic drain electrode and the second nanowire.

3. The semiconductor device of claim 1, wherein the first semiconductor layer is around sidewalls of the metallic source electrode, between the metallic source electrode and the substrate, and the second semiconductor layer is around sidewalls of the metallic drain electrode, between the metallic drain electrode and the substrate.

4. The semiconductor device of claim 1, wherein the nanowire transistor is a n-type transistor or a p-type transistor.

5. The semiconductor device of claim 1, wherein the nanowire is a rectangular nanowire, a circular nanowire, or a nanoribbon.

6. The semiconductor device of claim 1, wherein the first semiconductor layer has a thickness between the metallic source electrode and the nanowire less than 25 nm.

7. The semiconductor device of claim 1, wherein the nanowire includes Si, Ge, Sn, In, Ga, As, Al, InAs, SiGe, InGaAs, InP, or a metal oxide.

8. The semiconductor device of claim 1, wherein the first semiconductor layer or the second semiconductor layer is doped with boron (B) or phosphorus (P).

9. The semiconductor device of claim 1, wherein the first semiconductor layer or the second semiconductor layer includes boron doped Si, boron doped Ge, boron doped SiGe, phosphorus doped Si, phosphorus doped Ge, or phosphorus doped SiGe.

10. The semiconductor device of claim 1, wherein the gate electrode includes a metallic material, a conductive polymer, a phosphorus (n+) doped Si, a polysilicon, a titanium silicide, a boron doped SiGe, or an alloy of a semiconductor material and a metal.

11. The semiconductor device of claim 1, wherein the substrate includes silicon, sapphire, glass, polyimide, SiC, GaN, or AlN.

12. A computing device, comprising:
a processor; and
a memory device laterally separated from the processor, wherein the memory device or the processor includes a nanowire transistor comprising:
a substrate;
a channel region including a nanowire above the substrate;
a metallic source electrode and a metallic drain electrode above the substrate, wherein the metallic source electrode is laterally separated from a first end of the nanowire by a first semiconductor layer between the metallic source electrode and the nanowire, the first semiconductor layer having an uppermost surface co-planar with an uppermost surface of the metallic source electrode, and the metallic drain electrode is laterally separated from a second end of the nanowire by a second semiconductor layer between the metallic drain electrode and the nanowire, the second semiconductor layer having an uppermost surface co-planar with an uppermost surface of the metallic drain electrode;
a gate electrode over and around the nanowire, the gate electrode having a lateral width between the metallic source electrode and the metallic drain electrode that is greater than a lateral width of the nanowire between the metallic source electrode and the metallic drain electrode;
a first spacer above the substrate between the gate electrode and the metallic source electrode, a second spacer above the substrate between the gate electrode and the metallic drain electrode; and
a gate dielectric layer between the channel region and the gate electrode.

13. The computing device of claim 12, wherein the nanowire is a first nanowire, and the channel region further includes a second nanowire, the metallic source electrode is laterally separated from a first end of the second nanowire by the first semiconductor layer between the metallic source electrode and the second nanowire, and the metallic drain electrode is laterally separated from a second end of the second nanowire by the second semiconductor layer between the metallic drain electrode and the second nanowire.

14. The computing device of claim 12, wherein the first semiconductor layer is around sidewalls of the metallic source electrode, between the metallic source electrode and the substrate, and the second semiconductor layer is around sidewalls of the metallic drain electrode, between the metallic drain electrode and the substrate.

15. The computing device of claim 12, wherein the nanowire is a rectangular nanowire, a circular nanowire, or a nanoribbon.

16. The computing device of claim 12, wherein the computing device is a wearable device or a mobile computing device, the wearable device or the mobile computing device including one or more of an antenna, a touchscreen controller, a battery, an audio codec, a video codec, a power amplifier, a global positioning system (GPS) device, a compass, a Geiger counter, an accelerometer, a gyroscope, a speaker, or a camera coupled with the processor.

* * * * *